Figure 1:
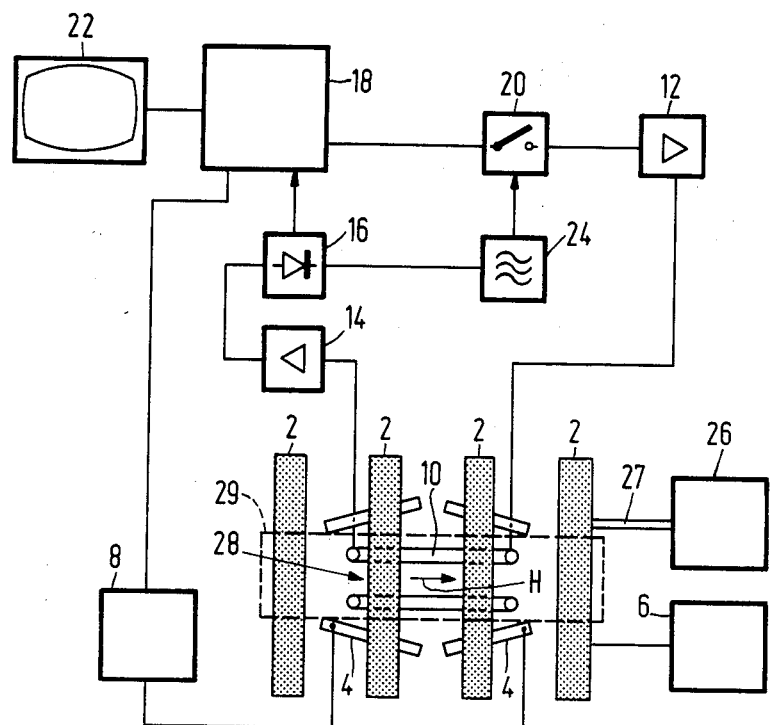

United States Patent [19]

Kemner et al.

[11] Patent Number: 4,737,718

[45] Date of Patent: Apr. 12, 1988

[54] MAGNETIC RESONANCE IMAGING APPARATUS INCLUDING A BIRD-CAGE R.F. COIL

[75] Inventors: Rudolf Kemner; Wilhelmus R. M. Mens; Hilco T. Kalmijn, all of Eindhoven, Netherlands

[73] Assignee: U.S. Philips Corporation, New York, N.Y.

[21] Appl. No.: 891,793

[22] Filed: Aug. 1, 1986

[30] Foreign Application Priority Data

Aug. 19, 1985 [NL] Netherlands .................... 8502273

[51] Int. Cl.$^4$ ............................................. G01R 33/20
[52] U.S. Cl. .................................... 324/322; 333/219
[58] Field of Search .................. 333/24 R, 185, 219; 324/300, 307, 309, 318, 313, 322, 316

[56] References Cited

U.S. PATENT DOCUMENTS 4,591,818  5/1986  Butson ............................... 324/320
4,638,253  1/1987  Jaskolski et al. ................... 324/318

Primary Examiner—Michael J. Tokar
Attorney, Agent, or Firm—Algy Tamoshunas

[57] ABSTRACT

Disclosed is a magnetic resonance imaging apparatus, with an r.f. coil which is designed on the basis of the sinusoidal current distribution across a circular-cylindrical surface about a central coil axis and which is, subject to a generally applicable looping-through condition $z_1 = -K z_2$, when K is a positive constant which depends on the number of bars and geometrical deviations, $z_1$ is the impedance of the bar conductors, and $z_2$ is the impedance of ring conductor elements between each two pair of bar conductors. The coil based on the above condition is particularly adapted to parasitic capacitances of the bar conductors and to the general shape of objects to be examined.

22 Claims, 3 Drawing Sheets

MAGNETIC RESONANCE IMAGING APPARATUS INCLUDING A BIRD-CAGE R.F. COIL

The invention relates to a magnetic resonance imaging apparatus which includes a substantially cylindrical r.f. coil in which a number of bar conductors, which extend axially across a cylinder surface of the cylinder, generate a substantially cosinusoidal current distribution across a circular-cylinder circumference.

An r.f. coil for such a magnetic resonance imaging apparatus is known from U.S. Pat. No. 4,339,718 and is based on the well-known fact that a cosinusoidal current distribution is required across the circumference of the cylindrical coil in order to obtain a homogeneous field distribution in such a coil. This object is achieved in a coil described therein by arranging pairs of two interconnected bar conductors, having different angles of aperture with respect to the common cylinder axis per pair, symmetrically opposite one another. The desired cosinusoidal current distribution is then obtained by means of a sinusoidal geometrical distribution of the bars. These solutions have many drawbacks; for example there are restrictions as regards the feasible geometry, the construction requires coils having a different radii, and residual inhomogeneity occurs due to the fact that the wires are locally situated far from one another, and that any deviation in the positioning thereof has a direct effect on the homogeneity of the field in the coil. Hereinafter, homogeneity of the field in the coil is to be understood to mean not only the desired homogeneity of an r.f. field to be generated in the coil by the coil, but also the equality of locally distributed measurement points in the coil in the detection of magnetic resonance signals to be emitted by an object. The construction of known coils described in U.S. Pat. No. 4,439,733 and also with reference to FIG. 6 of U.S. Pat. No. 4,339,718 requires a substantial space in the radial direction and is liable to cause interference fields.

It is an object of the invention to provide a magnetic resonance imaging apparatus which includes an r.f. coil in which said drawbacks are at least substantially mitigated. To achieve this, a magnetic resonance imaging apparatus of the kind set forth in accordance with the invention is characterized in that several bar-shaped conductors are activated via ring conductors and are positioned and coupled so that the following looping-through condition is satisfied:

$$\frac{z_1}{z_2} = 0.5 \left[ \frac{1}{\sqrt{1 + \left(\tan \frac{2\pi}{n}\right)^2}} - 1 \right]$$

where $z_1$ is the impedance of a ring conductor portion between two bar conductors, $z_2$ is the impedance of the bar conductors, and n is the number of bar conductors.

Because a coil in accordance with the invention need only satisfy the very general condition given above in order to realize a homogeneous field, a high degree of freedom is achieved as regards the design, so that the design can be adapted to supplementary requirements imposed by the equipment. The above condition inter alia allows a high degree of freedom as regards the distribution of reactive and inductive elements over the ring conductors and the bar conductors. Moreover, the general formula also enables determination of the extent to which the geometry and distribution of the bars and of the coil can be adapted to other geometrical requirements of the apparatus, such as accessibility for a patient to be examined and adaptation of the shape of the coil to objects to be examined.

In a preferred embodiment, $z_1$ is formed by a combination of a reactance and an inductance and $z_2$ is formed, for example, exclusively by an inductance. In a practical embodiment a coil is thus obtained which has capacitances and self-inductances in the ring conductor and a self-inductance in the bar conductor. The combination of a self-inductance and a capacitance in the ring conductor need not necessarily be a series connection of these elements. Using an inductance in the bar conductor, the condition will be satisfied for as long as the ring conductor elements behave capacitively for said frequency and use can also be made of, for example, a parasitic-like capacitance or coaxial cables for the ring conductor elements. The capacitance of the ring conductor elements may also be formed by a capacitive coupling to the bar conductors or to subsequent ring conductor elements.

In a further preferred embodiment, the geometry of the coil is adapted to objects to be measured, for example by making it elliptical instead of circular. Thus, for example, more space is created for the shoulders of a patient. Preferably, the bars which do not carry a current or carry only a small current are displaced furthest. Due to the displacement, a change may occur in the relevant (parasitic) capacitances for these bars. This can be compensated for, for example, by using thinner bars.

Similarly, it may not be desirable to distribute the bars equidistantly over the circumference. Based on the general formula, a homogeneous field can again be ensured in the coil by adaptation of the adjacent ring conductor impedance and/or the impedance of the bar. According to the looping-through condition, the effective impedance per complete ring conductor will represent exactly one whole wavelength for the selected frequency like as in the previous embodiments.

When an orthogonal bar distribution is chosen, which means a number of bars which is a multiple of four, the coil can also be constructed as a quadrature coil. For the single symmetrical tuning to be preferably used in those circumstances, a number of bars from the progression 8, 16, 32, ... is desirable. Tuning can then be performed on a bar which encloses an angle of 45°.

When the effect of capacitive elements on the coil is known, the geometry of the coil in the apparatus and, for example a Faraday cage enclosing the coil can be optimized. For example, the Faraday cage may be arranged nearer to the coil when the parasitic reactance of the cage on the ring conductors and the bars is taken into account for the impedance to be included in the coil.

A coil in accordance with the invention can be tuned, for example by varying the axial dimension of the coil. This method of tuning is particularly attractive for a quadrature coil construction, because the symmetry thereof will not be affected by this method. For the connection of coil conductors to an external power supply source use may be made of a low-ohmic real circuit in one of the conductors. A customary 50-ohm power supply source can be transformed to a desired impedance by capacitive division and addition of an adapted self-inductance.

Figure 2:
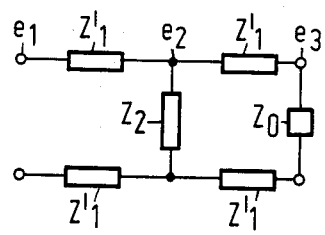
Figure 3:
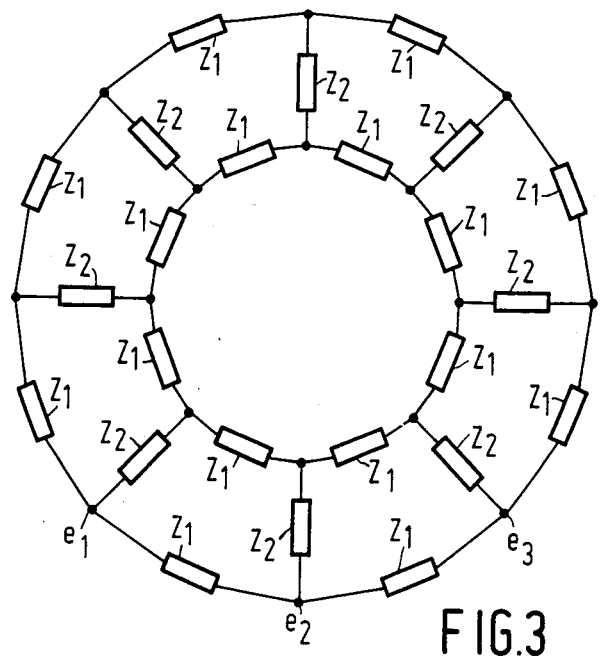
Figure 4A:
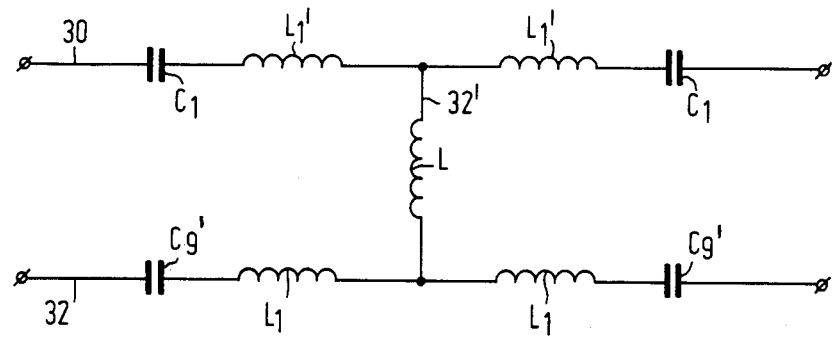
Figure 4B:
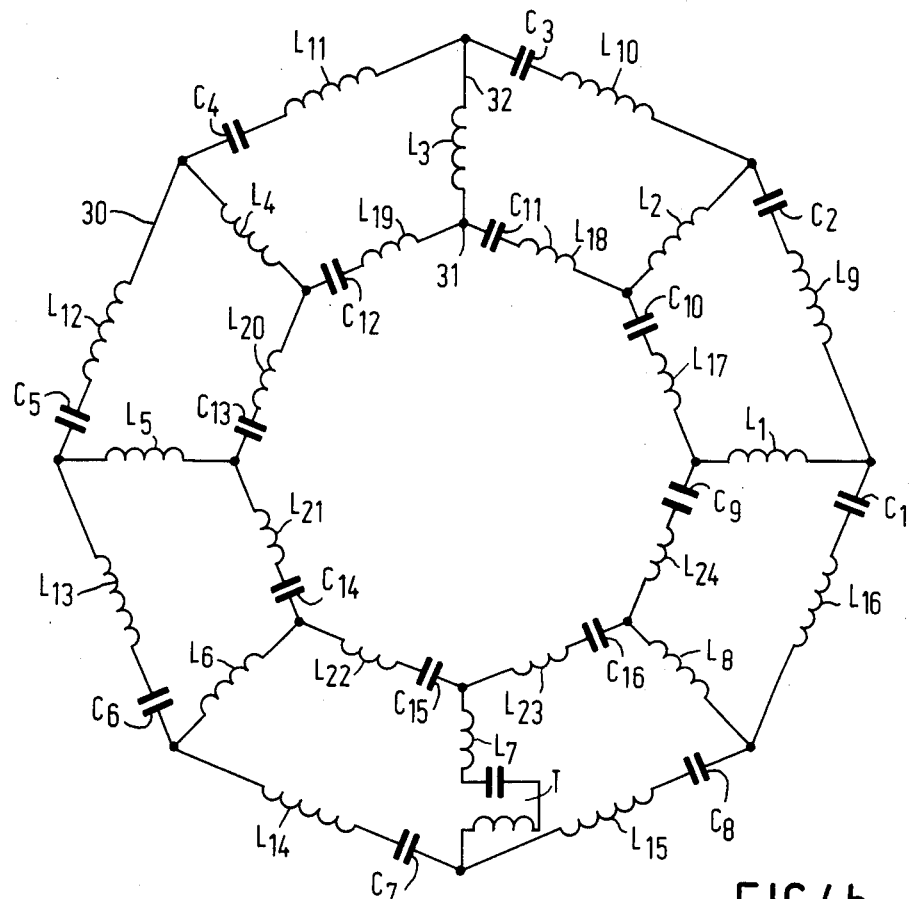
Figure 4C:
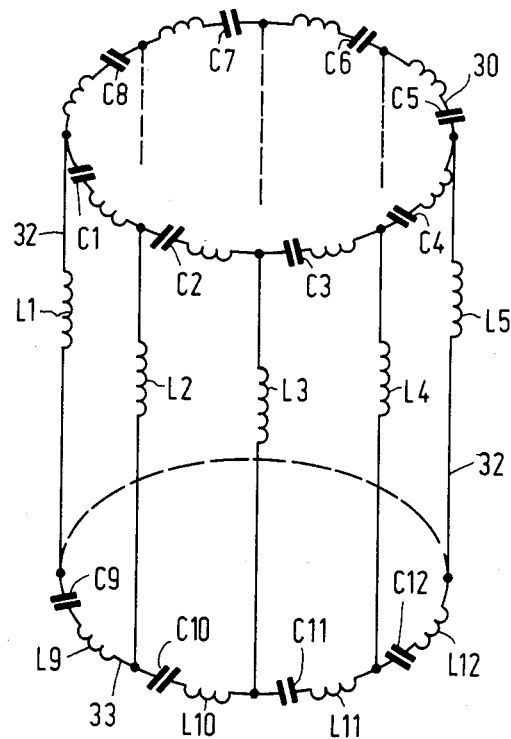
Figure 5:
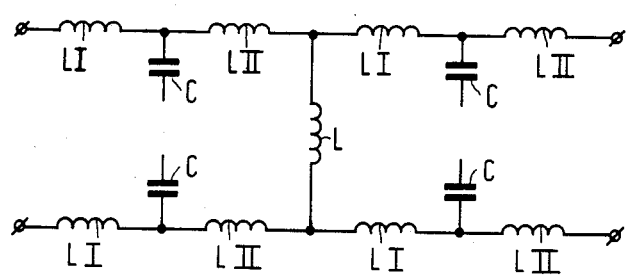
Figure 7A:
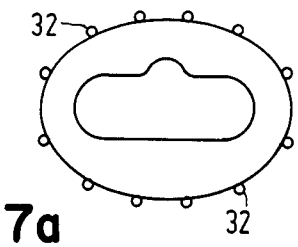
Figure 6:
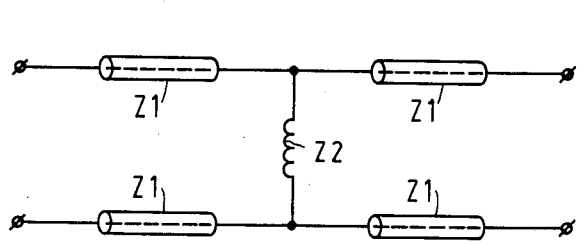
Figure 7B:
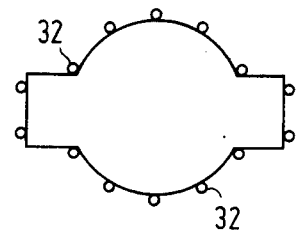

Some preferred embodiments in accordance with the invention will be described in detail hereinafter with reference to the drawing. Therein:

FIG. 1 shows a magnetic resonance imaging apparatus in accordance with the invention, FIG. 2 shows a basic section of an r.f. coil, FIG. 3 shows a relevant circuit diagram, FIG. 4a shows a basic section of a preferred embodiment of a coil in accordance with the invention, FIG. 4b shows the circuit diagram for the coil in accordance with the invention, FIG. 4c shows a perspective view of the coil in accordance with the invention, FIGS. 5 and 6 show basic sections for further preferred embodiments, and FIGS. 7a and 7b show preferred embodiments of coils adapted to object geometries.

A magnetic resonance imaging apparatus as shown in FIG. 1 includes a magnet system 2 for generating a steady magnetic field H, a magnet system 4 for generating magnetic gradient fields, and power supply sources 6 and 8 for the magnet system 2 and the magnet system 4, respectively. An r.f. magnet coil 10 serves to generate an r.f. magnetic alternating field; to this end, it is connected to an r.f. source 12. Coil 10 may also be used for detecting spin resonance signals generated by the r.f. field in an object to be examined. In that event coil 10 is connected to a signal amplifier 14. The signal amplifier 14 is connected to a phase-sensitive rectifier 16 which is connected to a central control device 18. The central control device 18 also controls a modulator 20 for the r.f. source 12, the power supply source 6, the power supply source 8 for the gradient coils, and a monitor 22 for display. An r.f. oscillator 24 controls the modulator 20 as well as the phase-sensitive rectifier 16 which processes the measurement signals. For possible cooling of the magnet coils 2 for the main field there is provided a cooling device 26 which includes cooling ducts 27. Such a cooling device may be use water for cooling resistance coils or, for example, liquid helium for cooling superconducting magnetic coils, as in the present case which involves a high field intensity. The transmitter coil 10 arranged within the magnetic systems 2 and 4 encloses a measurement space 28 which is large enough to accomodate patients to be examined in a medical diagnostic apparatus. In the measurement space 28, therefore, there can be generated a steady magnetic field H, gradient fields for selecting object slices, and a spatially homogeneous r.f. alternating field. The r.f. coil 10 is capable of combining the functions of both the transmitter coil and the measurement coil. Alternatively two functions can be performed by separate coils; for example, the measurement coils are then formed by surface coils. Hereinafter, the coil 10 will mostly be referred to as the transmitter coil. In accordance with the theorem of reciprocity, the same considerations hold good when the coil is used as a measurement coil. Around the coil 10 there is provided a Faraday cage 29 which shields the coil from r.f. fields.

FIG. 2 shows a circuit diagram of a basic section of an r.f. coil for such a magnetic resonance imaging apparatus. The diagram shows four impedances $z'_1$ which represent mutually equal impedances of the ring conductors which interconnect the bars, an impedance $z_2$ of a bar conductor, and an impedance $z_o$ as a termination impedance. None of these impedances is defined as yet. It has been found that for such a basic section generally applicable phase and amplitude conditions can be derived for the power supply of such a section. The phase-difference between $e_1$ and $e_3$ in the diagram is denoted by $\phi$. When basic sections are looped through in order to form a complete coil which includes n bar conductors as diagrammatically shown in FIG. 3, there will be a subsidiary condition that $e_1$ and $e_3$ must be the same as regards amplitude and that a phase shift $\phi = 2\pi/n$ must occur between successive conductors. Subject to this condition, a generally applicable condition can be derived in the form of a formula which represents the ratio of the impedances $z_1$ and $z_2$ and which, ignoring a correction factor for deviations in, for example the circle geometry or the distance between the bars, contains only the phase angle $2\pi/n$ as a variable. For the sake of brevity, ignoring the correction term, the looping-through condition stated in the preamble can be represented by $z_2 = -K z_1$, where $z_1$ and $z_2$ are said impedances and K is a positive constant value which depends on the number of bar conductors. $z_1$ and $z_2$ always have opposite signs; this follows directly from the general formula when it is considered that the quadratic term in the denominator of the lefthand term is always positive. It follows from the opposite sign that when one of the impedances is reactive, that is to say formed, for example by a capacitor, the other impedance must be inductive and hence be formed, for example by a self-inductance or coil.

Subject to the general applicable looping-through condition, various more or less practical coils can be designed. FIG. 4 shows a first example thereof; FIG. 4a shows a basic section for the coil, FIG. 4b shows a circuit diagram for the coil, and FIG. 4c is a perspective view of the coil. The coil shown includes eight bar conductors 32 which are accomodated between two ring conductors 30 and 33. Each of the bars has a self-inductance L numbered from L1 to L8. When the bar conductors act as self-inductances in the circuit for a given or desired frequency, the looping-through condition found imposes a reactive function on the ring conductor elements between each pair of bar conductors. The reactive elements in a first conductor 30 are shown as capacitances which are numbered from C1 to C8; for the second ring conductor 33 there are shown capacitances which are numbered from C9 to C16. Furthermore, the ring conductors have an inductive impedance which is represented by self-inductances which are numbered from L9 to L16 for the first ring conductor 30 and from L17 to L24 for the second ring conductor 33. The values of the capacitances C1-C16 and the inductances L9-L24, however, are substantially equal. Using a value of 0.1 $\mu$H for the coils of the ring conductors, a value of 0.5 $\mu$H for the coils of the bars, and a value of 17.5 pF for the capacitances of the ring conductors, a resonant frequency of 64 MHz is obtained for an adapted coil geometry. Thus, a coil design is obtained which is very suitable for high frequencies.

Another embodiment from the range of coils which can be designed subject to the general looping-through condition is described in EP No. 141383. The capacitances considered necessary in the bar conductors thereof have been avoided in the above design as they are not very practical elements. An embodiment which is also less practical is obtained when a pure reactance, hence a capacitance, is chosen for the impedance of the bar conductors and a pure inductance, so a coil, is chosen for the ring conductors. Although on the basis of the looping through condition, a coil which oscillates at a desired frequency can be designed using this geometry, this solution is less practical because, as has already been stated, the bar conductors should include at least also, but preferably only, an inductive element.

A major advantage of the coil shown in FIG. 4 consists is that the bar conductors do not include capacitive elements. The capacitances of the ring conductor elements may be constructed as coaxial coupling pieces so that a compact and rugged coil design is obtained. In the example chosen, the equivalent diagram for the ring conductor consists of a series connection of a capacitance and a self-inductance. Using only an inductance for the bar conductors, use can also be made of a parallel connection of, for example, two inductances LI and LII and a capacitance C as shown in FIG. 5. The capacitance has more or less the nature of a parasitic capacitance. For the frequency considered, the parallel connection must behave reactively again. For a capacitance having the nature of a parasitic capacitance, the entire parallel connection has the nature of a coaxial cable. When this correspondence is implemented, an equivalent diagram will be obtained as shown in FIG. 6, in which a coaxial cable is used for $z_1$ and an inductance for $z_2$. When on the basis of this circuit, the coil again comprises eight bars (which is, of course a comparatively arbitrary choice), on the basis of the looping-through condition and for a resonant frequency of 64 MHz, there will be a capacitance of 10 pF for the cable portion, a self-inductance of 0.5 $\mu$H for this portion, and a self-inductance of 0.5 $\mu$H for the impedance $Z_2$. Thus, a coil design is obtained which includes pieces of coaxial cable whose length merely needs adaptation, and bar conductors whose geometry has been adapted. A coil with this design is extremely practical for very high frequencies in the order of 100 MHz.

The foregoing examples clearly illustrate the advantage of the general nature of the looping-through condition.

A substantial additional advantage is that a higher degree of freedom is also achieved as regards the design of the external geometry of the coil. For example, if for some reason thicker, thinner, longer or shorter bar conductors are desired, the associated impedance values for the ring conductor elements can be found on the basis of the looping-through condition. Similarly, compensation can be made for variations of, for example, the parasitic capacitance of the bar conductors, for example, by a variation of the positions thereof with respect to, for example a Faraday cage 29 in the apparatus. Of course, the reverse is also applicable when the ring conductors must be adapted to external conditions. When sufficient information is available as regards the space and the environment of the coil is a magnetic resonance imaging apparatus, an optimum coil design can thus be provided for any desired resonant frequency.

A further deviation to be compensated for arises, for example when the coil is to be shaped so as to be noncircular in order to obtain a better filling factor, for example as shown in FIGS. 7a and 7b. By determining the number of distinct bar conductors which have been radially displaced, the required impedance value for the relevant position can be simply calculated. Such a displacement will often have an effect because the position of the bar conductor is changed by the displacement with respect to the Faraday cage or another conductive element. Preferably, bar conductors that are displaced carry only a small current in accordance with the cosinusoidal distribution. A bar conductor which does not carry a current and which hence coincides with the zero crossing of the current distribution can in principle also be omitted or partly omitted.

Corrections can also be made for nonuniformities in the distribution of the bar conductors over the surface of the cylinder. No inhomogeneities will be introduced into the measurement field as long as the current distribution across the surface of the (in this case) equivalent circular-cylinder surface is cosinusoidal, the ring conductors correspond to a whole wavelength, and the impedance values satisfy the looping-through condition.

As long as the ring conductors represent a phase shift equivalent to an entire wavelength, a given irregularity may be permitted as regards the distribution thereof over the bar connections, without the homogeneity of the field being distributed. This fact can be used, for example in order to deviate from the geometrical symmetry or from the switching-technical geometry in the coil. This may occur, for example in coil embodiments as shown in FIGS. 7a and 7b, in the case for omission of one of the bar conductors, and when tuning and matching circuits are inserted.

The coil can be powered and read by coupling into one of the bar conductors or by (preferably double) coupling into a ring conductor.

The tuning of the coil, the adjustment of the resonant frequency where, for example a range of plus and minus 0.5 MHz for an 100 MHz coil is desirable, is preferably performed near a coupling between a bar and a ring conductor element. Preferably, it is ensured that the voltage occuring across the capacitances in a conventional tuning circuit does not become excessively high. A matching circuit for coupling the transmission and the measurement field in an out, respectively, is also provided near such a coupling and has an impedance 0 for the relevant resonant frequency so that the phase relationship will not be distributed. When a coil in accordance with the invention is used as a quadrature coil, double tuning would be necessary. However, this can be avoided by providing coils which include a number of bars such that a bar conductor is present every 90° as well as every 45°, with a single tuning circuit in a 45° bar which then serves for the couplings situated at 90° at both sides thereof. Herein, a 45° bar is to be understood to mean any bar which encloses an angle of 45° with respect to two other bars, regardless of the quadrant and regardless also of or not whether or not any other bars are present therebetween. For matching of such coils, each of the two coupling points is again preferably situated near the bar ends. When the bar is suitably interrupted at that area and the interruption is bridged by an adapted matching circuit, any disturbance of the tuning can be prevented and suitable, quasi-ground points can be created for the equipment to be connected.

What is claimed is:

1. A magnetic resonance imaging apparatus comprising an r.f coil having a plurality of bar conductors which extend axially about a generally cylindrical surface of a measurement space having a central axis and means for activating said coil so as to generate a substantially cosinusoidal current distribution, said activating means comprising a plurality of ring conductors arranged around said central axis and coupled to said bar conductors, said bar conductors having an impedance which is substantially inductive at a resonant frequency of said coil and said ring conductors having an impedance which is substantially capacitive at said resonant frequency, said ring conductors being positioned and coupled so that the following looping-through condition is satisfied:

$$\frac{z_1}{z_2} = 0.5 \left[ \frac{1}{\sqrt{1 + \left(\tan\frac{2\pi}{n}\right)^2}} - 1 \right]$$

where $z_1$ is the impedance of a ring conductor portion between two bar conductors, $z_2$ is the impedance of a bar conductor, and n is the number of bar conductors.

2. A magnetic resonance imaging apparatus as claimed in claim 1 wherein said bar conductors are not all spaced by an equal distance from said central axis.

3. A magnetic resonance imaging apparatus as claimed in claim 1 or 2 wherein said r.f. coil has a substantially elliptical cross-section.

4. A magnetic resonance imaging apparatus as claimed in claim 1 wherein said bar conductors are not uniformly distributed about said cylindrical surface.

5. A magnetic resonance imaging apparatus as claimed in claim 1 wherein the number of said bar conductors is a multiple of 4 and including a single tuning circuit which is coupled to said r.f. coil via a bar conductor which is situated halfway between two mutually orthogonally oriented bar conductors.

6. A magnetic resonance imaging apparatus comprising an r.f. coil having a plurality of bar conductors which extend axially about a generally cylindrical surface of a measurement space having a central axis and means for activating said coil so as to generate a substantially cosinusoidal current distribution, said activating means comprising a plurality of ring conductors arranged around said central axis and coupled to said bar conductors, said bar conductors having an impedance which is substantially inductive and said ring conductors having an impedance which includes a series connection of a capacitance and a self-inductance, said ring conductors being positioned and coupled so that the following looping-through condition is satisfied:

$$\frac{z_1}{z_2} = 0.5 \left[ \frac{1}{\sqrt{1 + \left(\tan\frac{2\pi}{n}\right)^2}} - 1 \right]$$

where $z_1$ is the impedance of a ring conductor portion between two bar conductors, $z_2$ is the impedance of a bar conductor, and n is the number of bar conductors.

7. A magnetic resonance imaging apparatus as claimed in claim 6 wherein said bar conductors are not all spaced by an equal distance from said central axis.

8. A magnetic resonance imaging apparatus as claimed in claim 6 or 7 wherein said r.f. coil has a substantially elliptical cross-section.

9. A magnetic resonance imaging apparatus as claimed in claim 6 wherein said bar conductors are not uniformly distributed about said cylindrical surface.

10. A magnetic resonance imaging apparatus as claimed in claim 6 wherein the number of said bar conductors is a multiple of 4 and including a single tuning circuit which is coupled to said r.f. coil via a bar conductor which is situated halfway between two mutually orthogonally oriented bar conductors.

11. A magnetic resonance imaging apparatus comprising an r.f. coil having a plurality of bar conductors which extend axially about a generally cylindrical surface of a measurement space having a central axis and means for activating said coil so as to generate a substantially cosinusoidal current distribution, said activating means comprising a plurality of ring conductors arranged around said central axis and coupled to said bar conductors, said bar conductors having an impedance which is substantially inductive and said ring conductors having an impedance which includes a series connection of a self-inductance and a capacitance, said ring conductors being positioned and coupled so that the following looping-through condition is satisfied:

$$\frac{z_1}{z_2} = 0.5 \left[ \frac{1}{\sqrt{1 + \left(\tan\frac{2\pi}{n}\right)^2}} - 1 \right]$$

where $z_1$ is the impedance of a ring conductor portion between two bar conductors, $z_2$ is the impedance of a bar conductor, and n is the number of bar conductors.

12. A magnetic resonance imaging apparatus as claimed in claim 11 wherein said bar conductors are not all spaced by an equal distance from said central axis.

13. A magnetic resonance imaging apparatus as claimed in claim 11 or 12 wherein said r.f. coil has a substantially elliptical cross-section.

14. A magnetic resonance imaging apparatus as claimed in claim 13 wherein said bar conductors are not uniformly distributed about said cylindrical surface.

15. A magnetic resonance imaging apparatus as claimed in claim 11 wherein the number of said bar conductors is a multiple of 4 and including a single tuning circuit which is coupled to said r.f. coil via a bar conductor which is situated halfway between two mutually orthogonally oriented bar conductors.

16. A magnetic resonance apparatus as claimed in claim 11 wherein said ring conductors are sections of coaxial cables connected between bar conductors.

17. A magnetic resonance imaging apparatus as claimed in claim 16, including a superconducting magnet for generating a steady field of at least 2 tesla.

18. A magnetic resonance imaging apparatus comprising an r.f. coil having a plurality of bar conductors which extend axially about a generally cylindrical surface of a measurement space having a central axis and means for activating said coil so as to generate a substantially cosinusoidal current distribution, said activating means comprising a plurality of ring conductors arranged around said central axis and coupled to said bar conductors, said bar conductors having an impedance which includes a capacitively operating circuit formed by a self-inductance and a capacitance, and said ring conductors having an impedance which is substantially inductive, said ring conductors being positioned and coupled so that the following looping-through condition is satisfied:

$$\frac{z_1}{z_2} = 0.5 \left[ \frac{1}{\sqrt{1 + \left(\tan\frac{2\pi}{n}\right)^2}} - 1 \right]$$

where $z_1$ is the impedance of a ring conductor portion between two bar conductors, $z_2$ is the impedance of a bar conductor, and n is the number of bar conductors.

19. A magnetic resonance imaging apparatus as claimed in claim 18 wherein said bar conductors are not all spaced by an equal distance from said central axis.

20. A magnetic resonance imaging apparatus as claimed in claim 18 or 19 wherein said r.f. coil has a substantially elliptical cross-section.

21. A magnetic resonance imaging apparatus as claimed in claim 18 wherein said bar conductors are not uniformly distributed about said cylindrical surface.

22. A magnetic resonance imaging apparatus as claimed in claim 18 wherein the number of said bar conductors is a multiple of 4 and including a single tuning circuit which is coupled to said r.f. coil via a bar conductor which is situated halfway between two mutually orthogonally oriented bar conductors.

* * * * *